(12) United States Patent
Kim et al.

(10) Patent No.: US 6,544,822 B2
(45) Date of Patent: Apr. 8, 2003

(54) METHOD FOR FABRICATING MOSFET DEVICE

(75) Inventors: Tae Kyun Kim, Kyoungki-do (KR); Dae Hee Weon, Kyoungki-do (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

(21) Appl. No.: 09/884,049

(22) Filed: Jun. 20, 2001

(65) Prior Publication Data
US 2002/0001891 A1 Jan. 3, 2002

(30) Foreign Application Priority Data
Jun. 21, 2000 (KR) ............................................. 00-34321

(51) Int. Cl.[7] ..................... H01L 21/335; H01L 21/8232
(52) U.S. Cl. ........................ 438/142; 438/164; 438/253; 257/382; 257/384
(58) Field of Search ................................ 438/197, 142, 438/253, 230, 231, 300, 304, 305; 257/327, 336, 369

(56) References Cited
U.S. PATENT DOCUMENTS 6,232,641 B1 * 6/2001 Miyano et al. ............. 257/382
6,277,677 B1 * 8/2001 Lee ............................. 438/142

* cited by examiner

Primary Examiner—David Nelms
Assistant Examiner—Dung A Le
(74) Attorney, Agent, or Firm—Birch, Stewart, Kolasch & Birch, LLP

(57) ABSTRACT

A method for fabricating a MOSFET device having a metal gate with an ultra shallow junction and allowing the application of a self-aligned contact. A sacrificial gate is formed on a silicon substrate, as is a first silicon epitaxial layer, which is thinner than the sacrificial gate. Elevated source/drain regions are formed on the silicon substrate by implanting desired impurity ions. An interlayer insulating film is deposited over the resultant structure and polished to expose the sacrificial gate. A groove is formed in which a gate insulating film and a metal film are deposited. The metal film, the gate insulating film and the interlayer insulating film are polished until the first silicon epitaxial layer is exposed. A second silicon epitaxial layer is then formed on the first silicon epitaxial layer.

10 Claims, 7 Drawing Sheets

METHOD FOR FABRICATING MOSFET DEVICE

This nonprovisional application incorporates by reference the subject matter of Application No. 2000-34321 filed in Korea on Jun. 21, 2000, on which a priority claim is based under 35 U.S.C. §119(a).

BACKGROUND OF THE INVENTION

1. Field of the Invention

The present invention relates to a met hod for fabricating a MOSFET device, and more particularly to fabrication method for a MOSFET device having a metal gate capable of forming a ultra shallow junction and allowing application of a self-aligned contact process.

2. Description of the Related Art

As well known, gates are mainly made of polysilicon. This is because the polysilicon sufficiently meets desired properties required for gates, for example, high melting point, easy formation of thin films, easy patterning of lines, maintenance of stability in an oxidation atmosphere, and formation of planarized surfaces. Where such polysilicon gates are practically applied to MOSFET devices, they obtain a desired conductance by containing a dopant such as phosphorous (P), arsenic (As), or boron (B).

As the degree of integration of semiconductor devices increases, this results in a reduction in the value of certain parameters, such as the line width of gates, the thickness of gate insulating films, or the junction depth, in those semiconductor devices. For this reason, where highly integrated semiconductor devices are fabricated using polysilicon, it is difficult to realize a low resistance required in association with a micro line width. Thus, it is required to develop gates made of a new material substituted for polysilicon.

At the early stage of this development, active research and development efforts have been made in association with polycide gates made of a transition metal-silicide material. However, such polycide gates have a limitation in realizing a low resistance due to the fact that polysilicon still remains in those gates. To this end, active research and development have recently been directed at metal gates.

Where such a metal gate is made of a metal having a work function value corresponding to the mid band-gap of silicon, it can be fabricated into a single gate usable for both the NMOS type and the PMOS type. The metal having a work function value corresponding to the mid band-gap of silicon may include tungsten (W), tungsten nitride (WN), titanium (Ta), titanium nitride (TiN), molybdenum (Mo), tantalum (Ta), and tantalum nitride (TaN).

Where such a metal gate is practically applied to the manufacture of MOSFET devices, however, it has problems involved in the progression of processes, such as a difficulty in etching an associated metal film, damage to an associated silicon substrate during the etching process, and thermal damage resulting from thermal process conducted following the etching process.

For this reason, it is difficult to form such a metal gate using conventional gate formation processes. To this end, a method has been proposed in which metal gates are formed using a damascene process mainly used in the formation of metal lines.

As well known, since this metal gate formation method using the damascene process involves no etching process, it has advantages of preventing damage generated in a silicon substrate while being capable of using the conventional MOSFET process as it is.

Now, a conventional method for fabricating MOSFET device having a metal gate using a damascene process will be described in conjunction with FIGS. 1A to 1E.

Figure 1A:
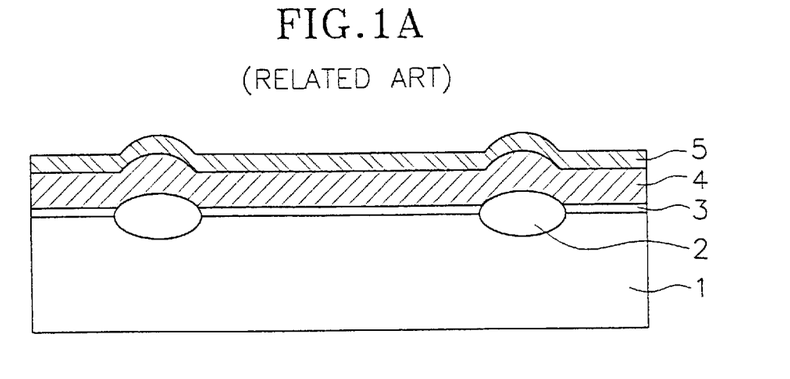
FIGS. 1A to 1E are cross-sectional views respectively illustrating a conventional method for forming a tungsten gate using a damascene process.

Referring to FIG. 1A, a silicon substrate 1 is prepared which has field oxide films 2 defining an active region. A thermal oxide film 3 is formed on the silicon substrate 1 to cover the active region. Thereafter, a polysilicon film 4 and a hard mask film 5 are sequentially deposited over the field oxide film 2 and the thermal oxide film 3.

Figure 1B:
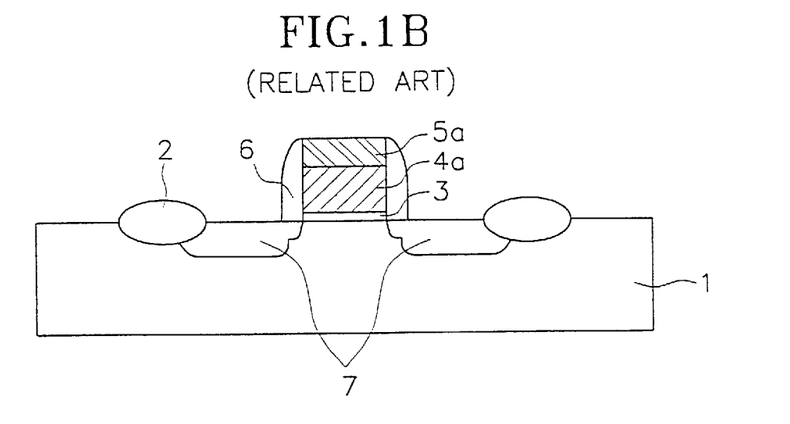

Referring to FIG. 1B, a hard mask pattern 5a is formed by patterning the hard mask film in accordance with a well-known photolithography process. The polysilicon film 4 and the thermal oxide film 3 are then etched under the condition in which the hard pattern 5a is used as an etch mask. As a result, a sacrificial gate 4a is formed. Desired impurity ions are implanted in a low concentration into portions of the silicon substrate, respectively arranged at opposite sides of the sacrificial gate 4a. A spacer 6 is formed on side walls of laminated sacrificial gate 4a and side walls of the hard mask pattern 5a and then, desired impurity ions are implanted in a high concentration, thereby forming source/drain regions 7 having a Lightly Doped Drain (LDD) structure.

Figure 1C:
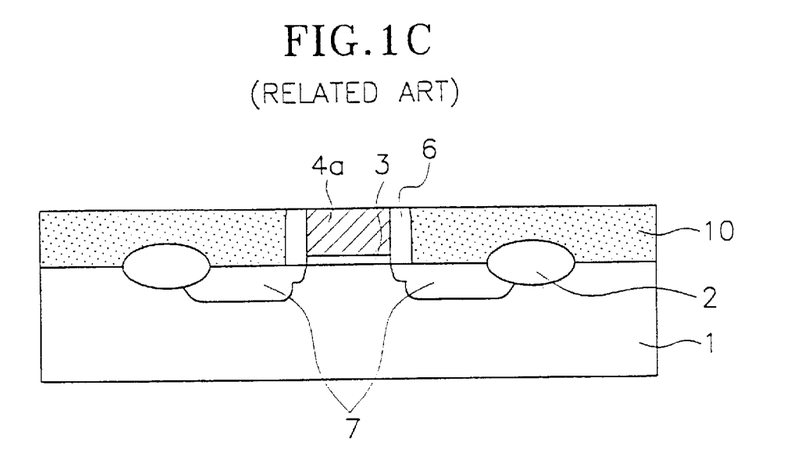

Referring to FIG. 1C, an interlayer insulating film 10 is deposited over the resultant substrate, thereafter, the interlayer insulating film 10 and the hard mask pattern 5a are polished in accordance with a CMP process using the sacrificial gate 4a as a polishing stop layer. As a result, the interlayer insulating film 10 is planarized and the sacrificial gate 4a is exposed.

Figure 1D:
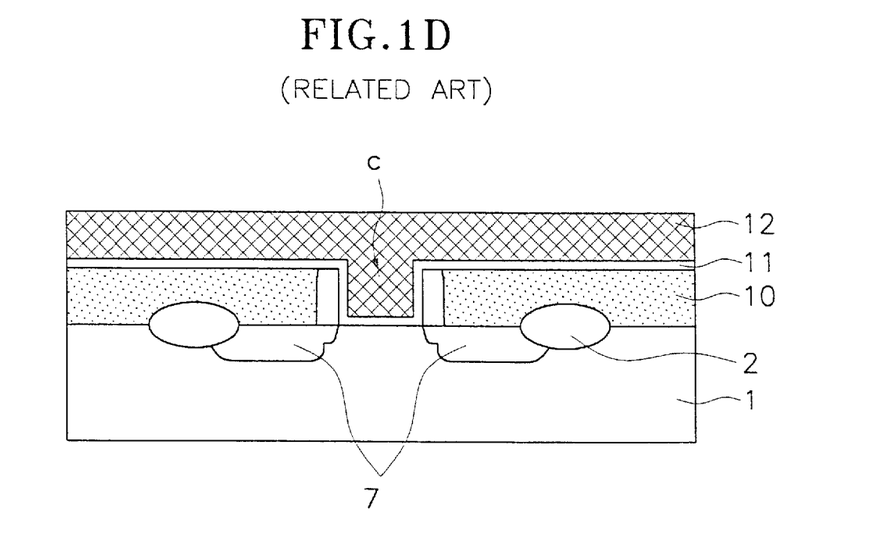

Referring to FIG. 1D, the exposed sacrificial gate and the thermal oxide film are removed, as a result, a groove C defining a region where a metal gate is to be formed is obtained. A gate insulating film 11 is subsequently formed on the resultant structure to have a uniform thickness, and then a metal film 12 for gate is deposited to completely fill the groove.

Figure 1E:
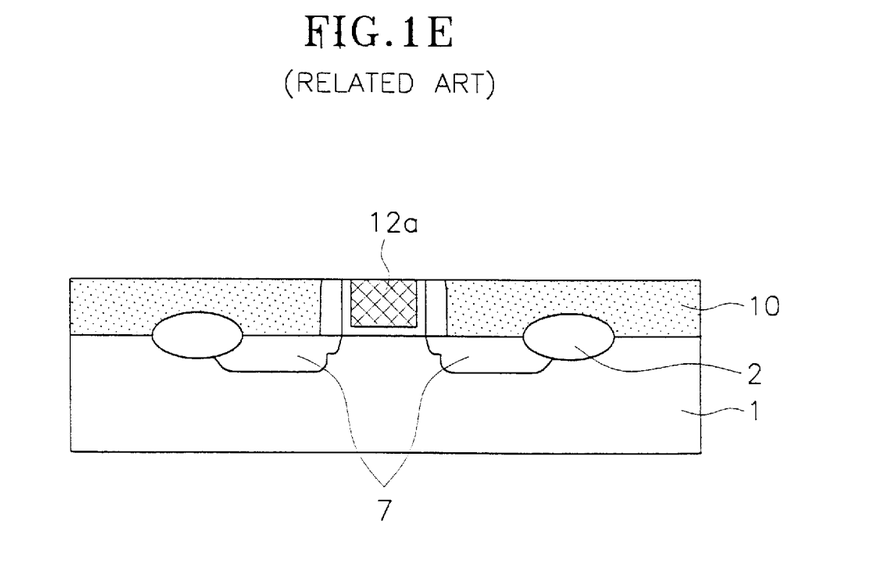

Referring to FIG. 1E, a metal gate 12a is formed by polishing the tungsten film 12 and the gate insulating film 11 using the interlayer insulating film 10 as a polishing stop layer, as a result, MOSFET device having a metal gate 12a is obtained.

The conventional method for fabricating MOSFET device has no significant problems. However, the junction produced is not an ultra shallow junction as is required in a highly integrated device. For this reason, additional processes are required to form elevated source/drain regions.

Figure 2:
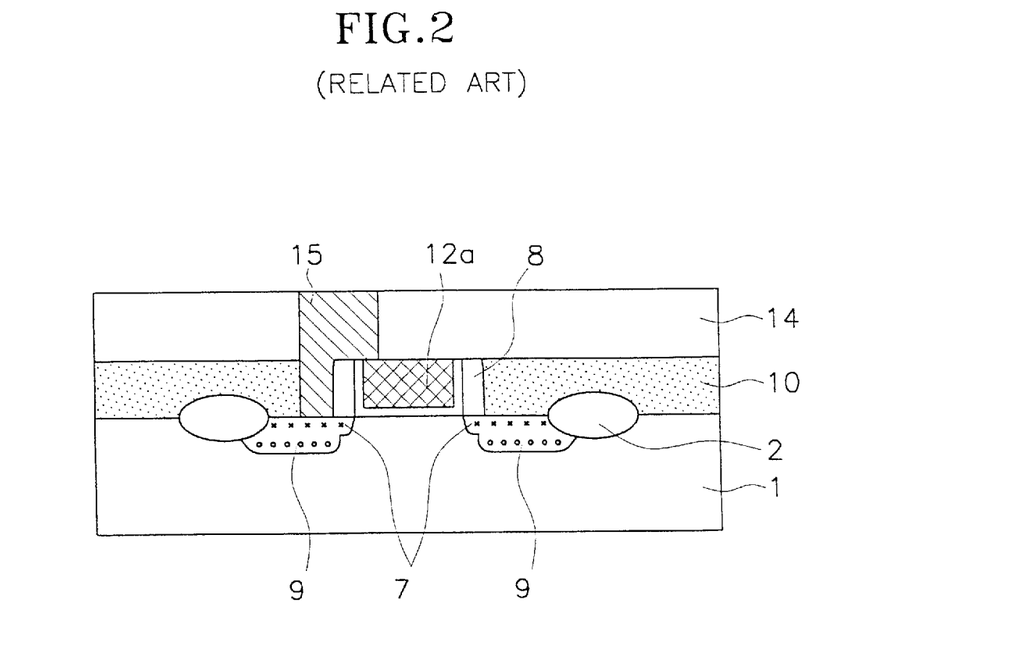
FIGS. 2 and 3 are cross-sectional views respectively illustrating problems involved in a MOSFET device having a conventional tungsten gate.

Moreover, the conventional method has a disadvantage that it can not be applied to a self aligned contact (SAC) process as a following process. That is, for example, where a mis-alignment of light exposure mask is generated during SAC process, as shown in FIG. 2, an electrical short is generated between the metal gate 12a and the contact plug 15. Thus, this MOSFET device involves a degradation in reliability and characteristics. In FIG. 2, a reference numeral 14 denotes an insulating film.

Figure 3:
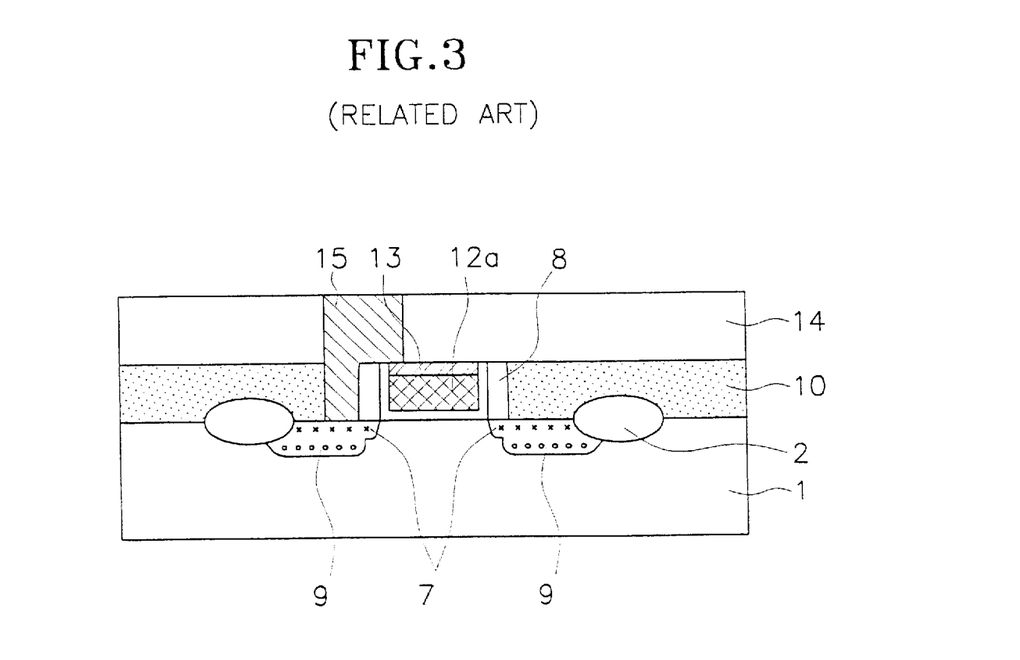

As shown in FIG. 3, an electrical short between the metal gate 12a and the contact plug 15 due to the mis-alignment of the light exposure mask can be avoided by forming a SAC barrier film 13 made of nitride film. However, for the formation of such an SAC barrier film, it is necessary to use a subsequent process involving a plurality of processing steps, for example, etching a metal gate, depositing a nitride film and polishing the nitride film, thereby resulting in an increase in the manufacturing time and costs of the MOSFET device. In particular, it is difficult to form an SAC barrier film made of nitride film due to the difficulties involved in etching all metal gates to have a uniform etch depth and in polishing a nitride film.

As a result, a MOSFET device having a conventional metal gate has disadvantages that additional processes are required to form an ultra shallow junction and that a subsequent SAC process cannot be applied unless an SAC barrier film is also formed on the metal gate.

SUMMARY OF THE INVENTION

Therefore, an object of the invention is to provide a method for fabricating a MOSFET device having a metal gate, capable of forming an ultra shallow junction and allowing subsequent application of an SAC process.

In accordance the present invention, this object is accomplished by providing a method for fabricating a MOSFET device (and the MOSFET device itself) comprising: forming a sacrificial gate on an active region of a silicon substrate; forming a first silicon epitaxial layer, thinner than the sacrificial gate, on the silicon substrate at opposite sides of the sacrificial gate to cover the active region; forming elevated source/drain regions on the silicon substrate, respectively arranged at opposite sides of the sacrificial gate by implanting desired impurity ions into the silicon substrate via the first silicon epitaxial layer; forming an interlayer insulating film on the resultant structure; polishing the interlayer insulating film to expose the sacrificial gate; removing the exposed sacrificial gate to form a groove defining a region where a metal gate is to be formed; forming a gate insulating film and a metal film on the resultant structure sequentially; forming a metal gate within the groove by polishing the metal film, the gate insulating film and the interlayer insulating film until the first silicon epitaxial layer is exposed; and forming a second silicon epitaxial layer on the first silicon epitaxial layer.

Advantages of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above objects, and other features and advantages of the present invention will become more apparent after reading the following detailed description when taken in conjunction with the drawings, in which.

DETAILED DESCRIPTION OF THE INVENTION

Figure 4A:
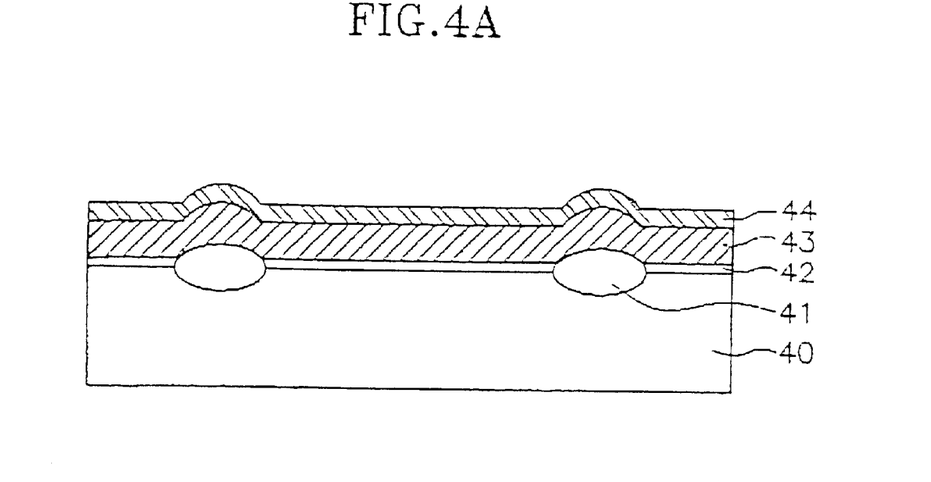
FIGS. 4A to 4F are cross-sectional views respectively illustrating a method for fabricating a MOSFET device in accordance with a preferred embodiment of the present invention.

Referring to FIG. 4A, a silicon substrate 40 provided with field oxide films 41 defining an active region is first prepared. An thermal oxide film 42 is then formed on the silicon substrate to cover the active region in accordance with a thermal oxidation process. A polysilicon film 43 is deposited to a thickness of 2,000 to 4,000 Å over the thermal oxide film 42 and the field oxide film 41 in accordance with a Low Pressure (LP)-CVD process. The polysilicon film 43 is doped with a dopant. The doping of the dopant may be achieved in an in-situ fashion during the deposition of the polysilicon film 43. Alternatively, the dopant may be doped in accordance with an ion implantation process after the deposition of the polysilicon film 43. A hard mask film 44 made of nitride film or oxide film is deposited to a thickness of 800 to 1,000 Å over the polysilicon film 43.

Figure 4B:
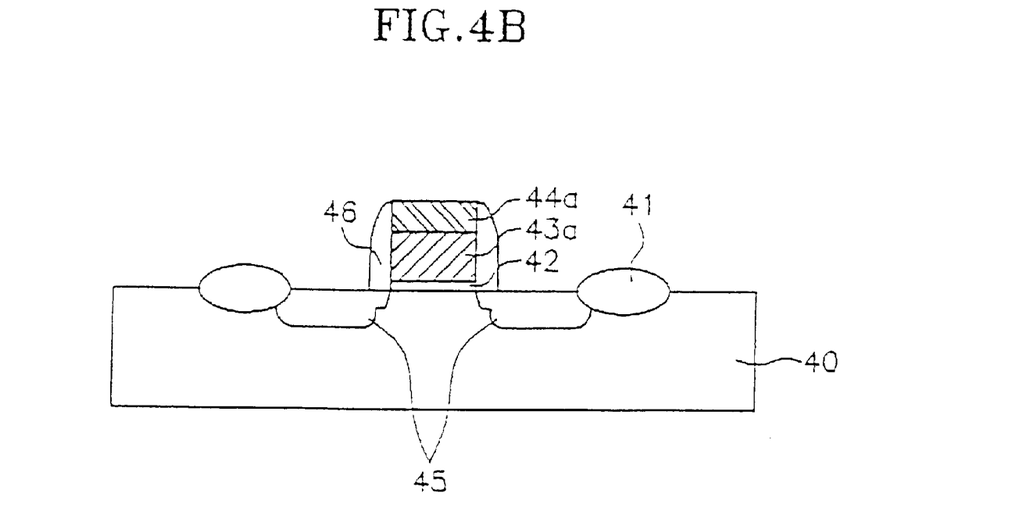

Referring to FIG. 4B, a hard mask pattern 44a is formed by patterning the hard mask film in accordance with a well-known photolithography process. The polysilicon film 43 and the thermal oxide film 42 are etched in accordance with a etch process using the hard mask pattern 44a. As result, a sacrificial gate 43a is formed on the silicon substrate 40 to cover the active region. Desired impurity ions are implanted in a low concentration into portions of the silicon substrate, respectively arranged at opposite sides of the sacrificial gate 43a, thereby forming a LDD region 45 on portions of the silicon substrate. A spacer 46 is formed on side walls of the laminated sacrificial gate 43a and side walls of the hard mask pattern 44a by deposition of the oxide film and a blanket etch process of the oxide film sequentially carried out. Then, desired impurity ions are implanted a high concentration, thereby forming source/drain regions 45 having a lightly doped drain (LDD) structure.

Figure 4C:
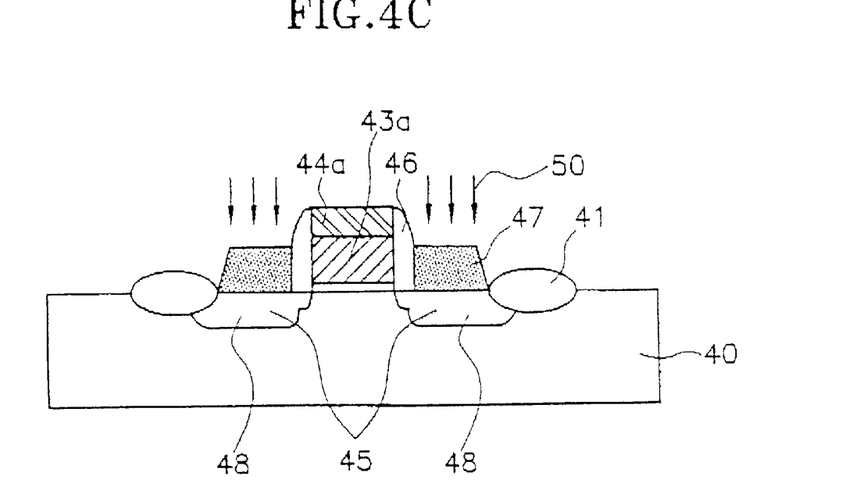

Referring to FIG. 4C, a first silicon epitaxial layer 47 is grown to a thickness thinner than the sacrificial gate 43a, for example, 1,500 to 3,000 Å on the silicon substrate 40 to cover source/drain regions in accordance with a selective epitaxial growth (SEG) process. Desired impurity ions 50 are implanted into the silicon substrate 40 via the first silicon epitaxial layer 47, as a result, elevated source/drain regions 48 are formed on portions of the silicon substrate, respectively arranged at opposite sides of the sacrificial gate.

The SEG process is conducted in accordance with a LP-CVD process or UHV-CVD (ultrahigh vacuum-chemical vapor deposition) process. Where the SEG process is applied using the UHV-CVD method, $Si_2H_6$ gas and $Cl_2$ gas are used as a deposition gas at the pressure of several mTorr and at the temperature of 400 to 800° C. Where a SEG process is applied using the LP-CVD method, $H_2$ gas is used as a carrier gas and DCS gas and HCl gas of hundreds of sccm are used as a deposition gas at the pressure of several to hundreds of Torr and at the temperature of 750 to 1,000° C. The SEG process using the LP-CVD method is subjected to an additional hydrogen bake at the temperature of over 800° C., preferably 800 to 1000° C. for 1 to 3 minutes. Moreover, where the SEG process using the LP-CVD method is applied, a silicon germanium epitaxial layer may be grown (by $GeH_4$ gas added to the deposition gas) instead of the silicon epitaxial layer. Where the SEG process using the method above-mentioned is carried out, $PH_3$ gas or $AsH_3$ may be doped in an in-situ fashion to decrease the contact resistance of the first silicon epitaxial layer 47. Here, the flow rate of the $PH_3$ gas or the $AsH_3$ gas is hundreds of sccm and the concentration is $1 \times 10^{19}$ to $1 \times 10^{20}$ ions/cm².

The first silicon epitaxial layer 47 is subjected to the SEG process while the silicon epitaxial layers grown on opposite sides having the field oxide film 41 interposed are not interconnected.

Figure 4D:
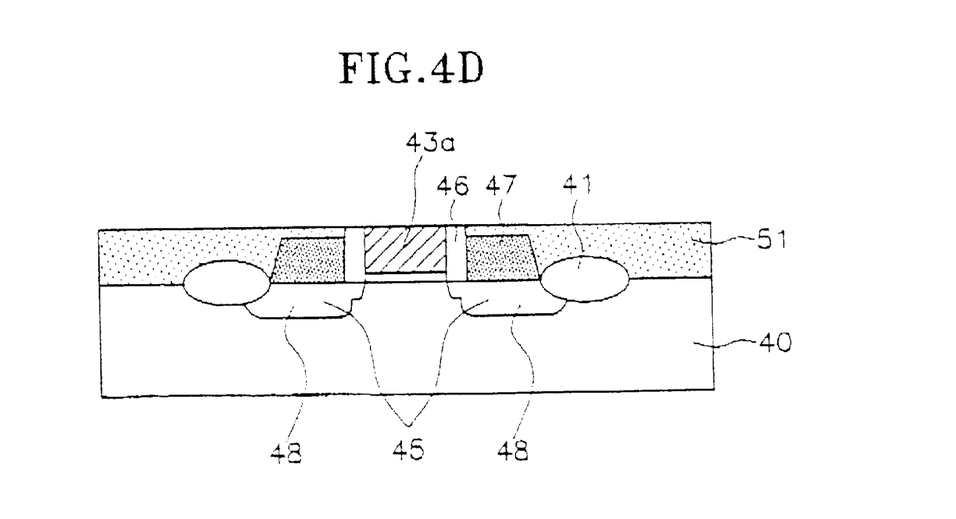

Referring to FIG. 4D, an interlayer insulating film 51 is deposited to the thickness of 4,000 to 6,000 Å over the resultant substrate, and then the interlayer insulating film 51, the hard mask pattern 44a and the spacer 46 are polished away using the sacrificial gate 43a as a polishing stop layer. As a result, the interlayer insulating film 51 is planarized and the sacrificial gate 43a is exposed.

Figure 4E:
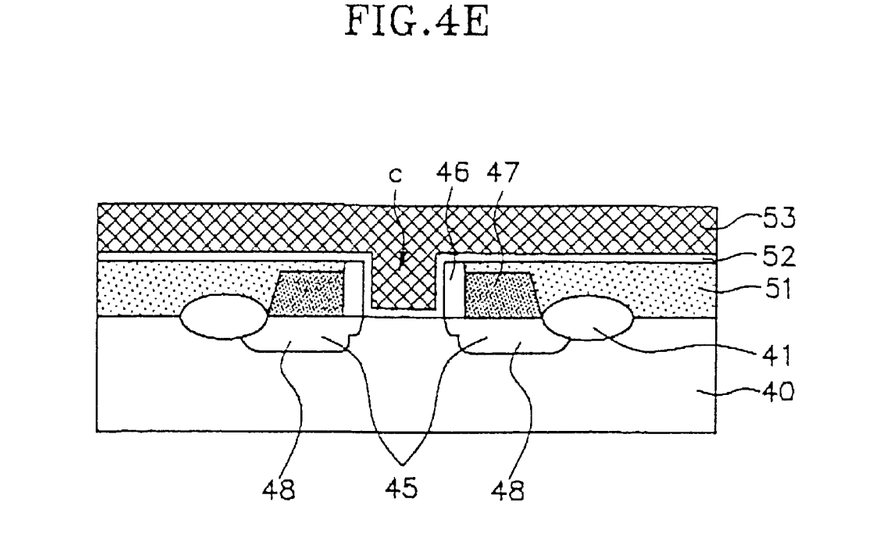

Referring to FIG. 4E, the exposed sacrificial gate and a thermal oxide film are removed in accordance with a wet or dry etch process. As a result, a region where a metal gate is to be formed is defined. A gate insulating film 52 is formed to have a uniform thickness on the resultant substrate, thereafter, a desired metal layer 53 is deposited to completely fill the groove. Here, the gate insulating film 52 is formed by one selected from oxide film, nitride oxide film, and high dielectric film in accordance with growth or deposition process. The metal film 53 is one selected from the group comprising W, WN, Ti, TiN, Mo, and Ta and it is formed in accordance with a physical vapor deposition process or a chemical vapor deposition process.

Figure 4F:
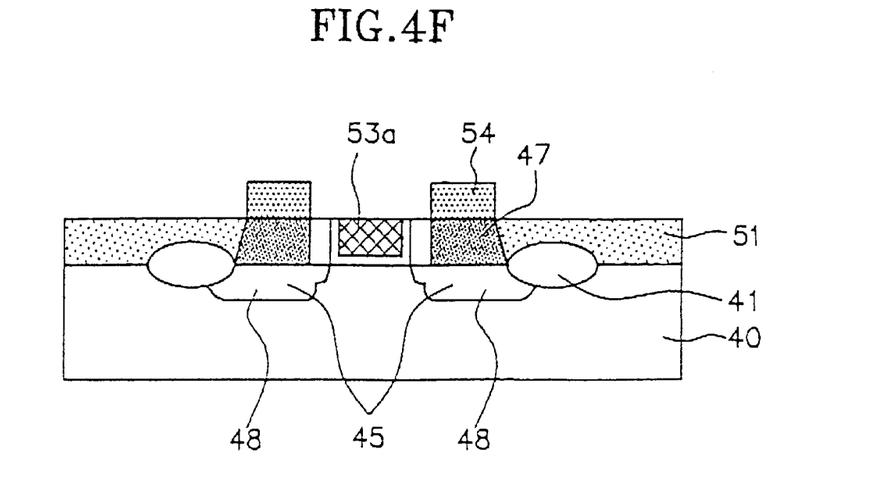

Referring to FIG. 4F, a metal gate 53a is formed within a groove C obtained by removal of the sacrificial gate by polishing the metal film 53, the gate insulating film 52 and the interlayer insulating film 51 using the first silicon epitaxial layer 47 as a polishing stop layer. A second epitaxial 54 is grown to a thickness of 400 to 700 Å only on the first silicon epitaxial layer 47 in accordance with a SEG process. As a result, a MOSFET device having a metal gate in accordance with the present invention is obtained. The SEG process is conducted under the same condition as the first silicon epitaxial layer 47 is grown, in particular, under the condition that the silicon epitaxial layers grown on opposite sides having the metal gate 53a interposed are not interconnected.

As described above, the method of present invention is capable of easily forming elevated source/drain regions using only a conventional implantation process by forming a first silicon epitaxial layer on portions of the silicon substrate where the source/drain regions are to be formed prior to forming the regions. Therefore, in accordance with the present invention, a MOSFET device having a ultra shallow junction is easily obtained.

Figure 5:
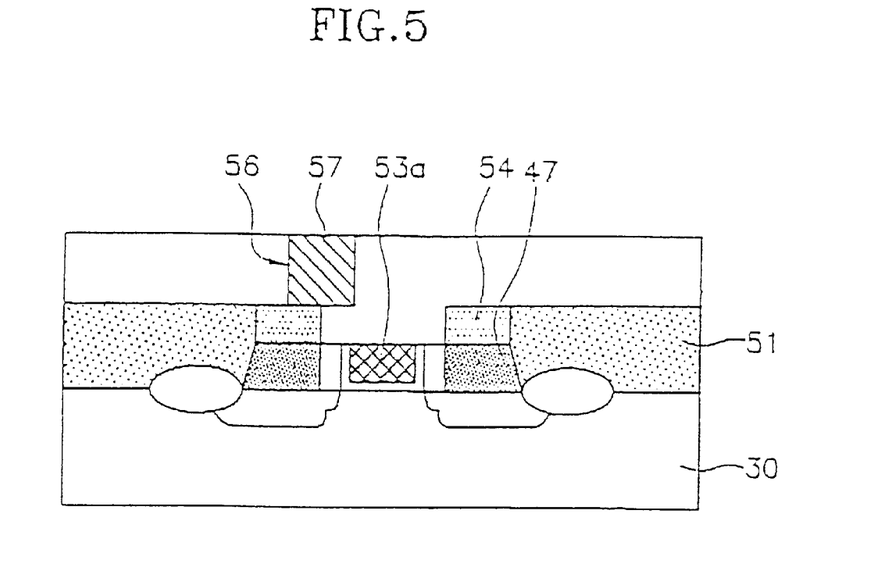
FIG. 5 is a cross-sectional view illustrating SAC process applied to a MOSFET device having a metal gate in accordance with the present invention.

Furthermore, in accordance with the present invention, it is possible to use an SAC process subsequently because a second silicon epitaxial layer is formed higher than a metal gate on a plane. That is, where the MOSFET device according to the present invention is subjected to a subsequent SAC process, as shown in FIG. 5, despite the mis-alignment that can be generated in a light exposure mask, the metal gate 53a is not exposed by the contact hole 56. This is because a second silicon epitaxial layer 54 is disposed higher than a metal gate 53a on plane. Therefore, an electrical short between the contact plug 57 formed within the metal gate 53a and contact hole 56 is prevented. In particular, a MOSFET device in accordance with the present invention provides an advantage in that a contact depth is decreased where a SAC process is subsequently applied. Therefore, in accordance with the present invention, an SAC process may be applied subsequently without forming an SAC barrier film on the metal gate.

Consequently, the method for fabricating a MOSFET device in accordance with the present invention is capable of easily realizing an ultra shallow junction using an SEG process.

Moreover, an SAC process can be applied subsequently without forming an SAC barrier film, thereby providing an improvement in the characteristics and reliability of the device. Thus, the method of the present invention can be advantageously applied to the manufacture of highly integrated devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a MOSFET device, comprising:
   forming a sacrificial gate on an active region of a silicon substrate;
   forming a first silicon epitaxial layer, thinner than the sacrificial gate, on the silicon substrate at opposite sides of the sacrificial gate to cover the active region;
   forming elevated source/drain regions on the silicon substrate, respectively arranged at opposite sides of the sacrificial gate by implanting desired impurity ions into the silicon substrate via the first silicon epitaxial layer;
   forming an interlayer insulating film on the resultant structure;
   polishing the interlayer insulating film to expose the sacrificial gate;
   removing the exposed sacrificial gate to form a groove defining a region where a metal gate is to be formed;
   forming a gate insulating film and a metal film on the resultant structure sequentially;
   forming a metal gate within the groove by polishing the metal film, the gate insulating film and the interlayer insulating film until the first silicon epitaxial layer is exposed; and
   forming a second silicon epitaxial layer on the first silicon epitaxial layer.

2. The method according to claim 1, wherein the first and the second silicon epitaxial layers are formed in accordance with a selective epitaxial growth process using a UHV-CVD (ultrahigh vacuum-chemical vapor deposition) method or a LP-CVD (low pressure-chemical vapor deposition) method.

3. The method according to claim 2, wherein the selective epitaxial growth process using the UHV-CVD method is conducted using $Si_2H_6$ gas and $Cl_2$ gas at a pressure of several mTorr and at the temperature of 400 to 800° C.

4. The method according to claim 2, wherein the selective epitaxial growth process using the LP-CVD method is conducted using $H_2$ gas as a carrier gas, DCS (dichloral silane) and HCl gas of hundreds of sccm as a deposition gas at a pressure of several to hundreds of Torr and at a temperature of 750 to 1,000° C.

5. The method according to claim 2, wherein the selective epitaxial growth process includes an additional hydrogen bake process carried out at a temperature of 800 to 1,000° C. for 1 to 3 minutes.

6. The method according to claim 4, wherein the selective epitaxial growth process is conducted to grow silicon germanium epitaxial layer by adding $GeH_4$ gas.

7. The method according to claim 2, wherein $PH_3$ or $AsH_3$ gas is doped in an in-situ fashion during the selective epitaxial growth to form the first silicon epitaxial layer.

8. The method according to claim 7, wherein the flow rate of the $PH_3$ or the $AsH_3$ gas is hundreds of sccm and the concentration is $1\times10^{19}$ to $10^{20}$ ions/cm$^2$.

9. The method according to claim 1, wherein the first silicon epitaxial layer is formed to a thickness of 1,500 to 3,000 Å.

10. The method according to claim 1, wherein the second silicon epitaxial layer is formed to a thickness of 400 to 700 Å.

* * * * *